United States Patent [19]
Glica

[11] Patent Number: 5,130,569
[45] Date of Patent: Jul. 14, 1992

[54] POWER-ON RESET CIRCUIT

[75] Inventor: Stephen J. Glica, Somerset, N.J.

[73] Assignee: Harris Corporation, Melbourne, Fla.

[21] Appl. No.: 667,932

[22] Filed: Mar. 12, 1991

[51] Int. Cl.$^5$ .................. G11C 11/00; H07K 3/01
[52] U.S. Cl. .................. 307/272.3; 307/307;
307/350; 307/296.1; 307/296.6
[58] Field of Search .............. 307/272.3, 307, 350,
307/296.1, 296.6

[56] References Cited

U.S. PATENT DOCUMENTS

| | | | |
|---|---|---|---|
| 4,300,065 | 11/1981 | Remedi et al. | 307/571 |
| 4,446,381 | 5/1984 | Dalrymple | 307/272.3 |
| 4,658,156 | 4/1987 | Hashimoto | 307/350 |
| 4,812,679 | 3/1989 | Mahabadi | 307/272.3 |
| 4,983,857 | 1/1991 | Steele | 307/272.3 |

Primary Examiner—Eugene R. LaRoche
Assistant Examiner—Michael B. Shingleton
Attorney, Agent, or Firm—Henry I. Schanzer

[57] ABSTRACT

A power-on reset circuit produces a momentary signal when the operating potential increases above a first threshold and when the operating potential decreases below a second threshold level. In a preferred embodiment, the circuit includes first and second IGFETs of first conductivity having their conduction paths connected in series between a positive operating terminal and a first node and third and fourth IGFETs of second conductivity having their conduction paths connected in series between the first node and a negative operating terminal. An inverter is connected at its input to the first node. The output of the inverter is coupled via a first feedback network to the intersection of the conduction paths of the third and fourth IGFETs to control the voltage level at which the third IGFET conducts when power ramps up. The output of the inverter is also coupled via a second feedback network to the intersection of the conduction paths of the first and second IGFETs to control the voltage level at which the second IGFET conducts when power ramps down.

7 Claims, 2 Drawing Sheets

POWER-ON RESET CIRCUIT

BACKGROUND OF THE INVENTION

This invention relates to switching circuits and particularly to "power-on reset" circuits.

A power on reset circuit, as that term is used herein, is a circuit which produces a momentary output signal upon initial application of power to the circuit or upon interruption of the power. Such circuits may be used, for example, for placing counters, registers, memories or other circuits in a desired initial condition.

Selection of a power on reset circuit for a particular application may involve one or more of the following criteria: static and dynamic response, operating voltage range, steady-state power dissipation, and ease of implementation in integrated circuit form. The static and dynamic response should be such that the circuit operation is essentially independent of the supply voltage rise time. The operating voltage range should be such that the reset circuit does not require more voltage than the device with which it is to be used which otherwise would limit the operating range of the utilization device. The steady state power dissipation should be minimal, and ideally, zero. Finally, the circuit should not require physically large elements (such as high valued capacitors) which would make implementation as an integrated circuit difficult if not impossible.

Known circuits which meet many of the above criteria are shown and described in U.S. Pat. No. 3,809,926 titled "Window Detector Circuit" which issued to A. W. Young on May 7, 1974, in U.S. Pat. No. 4,045,688 titled "Power-on Reset Circuit" which issued to R. G. Stewart in Aug., 1977 and in U.S. Pat. No. 4,594,518 titled "Voltage Line Sensing Circuit" which issued to R. G. Pollachek on Jun. 10, 1986.

The present invention is directed to a new and improved circuit which includes means for sensing when the operating voltage increases above a first threshold value and means for sensing when the operating voltage decreases below a second threshold value. The circuit of the invention also includes additional advantageous operating characteristics discussed in detail below.

SUMMARY OF THE INVENTION

A power-on reset (POR) circuit embodying the invention includes means for sensing when the amplitude of an operating potential applied between first and second power terminals exceeds a first value and when the operating potential decreases below a second value.

In a preferred embodiment, the circuit includes first and second IGFETS of a first conductivity-type having their conduction paths connected in series between the first power terminal and a first node and third and fourth IGFETS of a second conductivity-type having their conduction paths connected in series between the first node and the second power terminal. An inverter is connected at its input to the first node. The output of the inverter is coupled via feedback means to the intersection of the conduction paths of the third and fourth IGFETS to control the voltage level at which the third IGFET conducts when power ramps up and to the intersection of the conduction paths of the first and second IGFETS to control the voltage level at which the second IGFET conducts when the power ramps down.

BRIEF DESCRIPTION OF THE DRAWING

In the accompanying drawing, like reference characters denote like components.

DETAILED DESCRIPTION OF THE INVENTION

Figure 1:
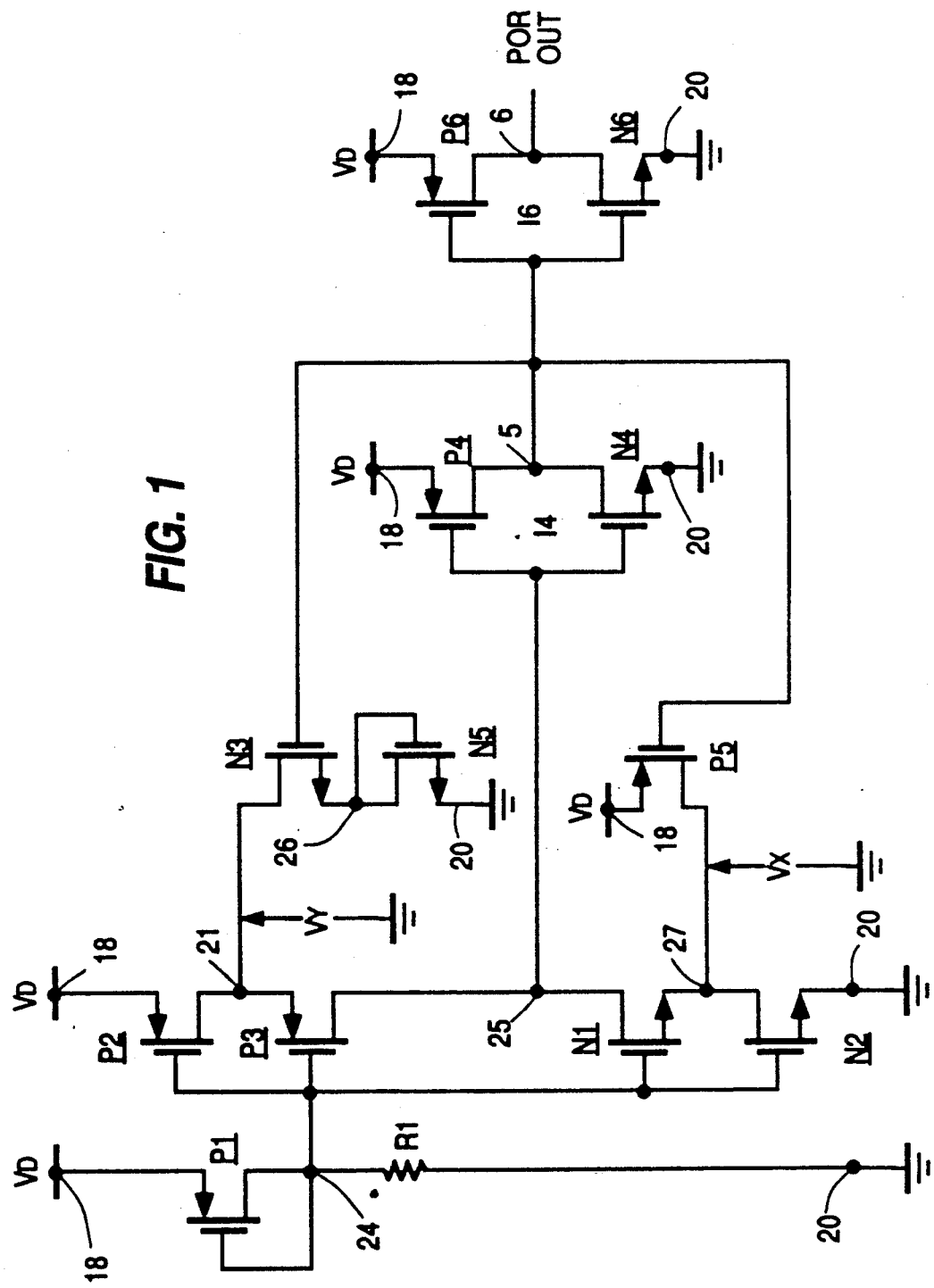
FIG. 1 is a schematic diagram of a power-on reset circuit embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor" when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and a second electrode referred to as the source and drain defining the ends of a conduction path, and a control electrode (gate) whose applied potential determines the conductivity of the conduction path. For a P-type IGFET the source electrode is defined as that electrode of the first and second electrodes having the highest potential applied thereto. For an N-type IGFET, the source electrode is defined as that electrode of the first and second electrodes having the lowest potential applied thereto.

2. The devices used are bidirectional in the sense that when an enabling signal is applied to the control electrode, current can flow in either direction in the conduction path defined by the first and second electrodes 3. For conduction to occur, the applied gate-to-source potential (Vgs) must be in a direction to forward bias the gate with respect to the source and must be greater in magnitude than a given value which is defined as the threshold voltage (Vt). Thus, where the applied Vgs is in a direction to forward bias the transistor but is lower in amplitude than Vt the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is equal to the threshold voltage (Vt) of the device (Vs=Vg−Vt).

Referring to FIG. 1, there is shown a first stage comprised of an IGFET P1 and a resistor R1. The source of P1 is connected to power terminal 18 to which is applied an operating potential ($V_D$) which is positive with respect to the potential Vss or ground applied to power terminal 20. The gate and drain of P1 are connected to node 24 which is returned via a resistor R1 to terminal 20. So connected, P1 functions as a diode for producing at node 24 a voltage (V24) which is equal to the operating potential (Vd) applied to terminal 18 minus the threshold voltage drop ($V_T$) of P1. [V24 is equal to $Vd - V_t$]. The operating voltage ($V_D$) applied to terminal 18 is the most positive voltage of the circuit and it has a maximum amplitude of $V_{DD}$ volts.

The output (node 24) of the first stage is connected to the input of a second stage which is a compound inverter comprised of two IGFETS of P-conductivity type (P2, P3) and two IGFETS of N-conductivity type (N1, N2). The gates of IGFETS P2, P3, N1 and N2 are all connected to node 24. The source of P2 is connected to terminal 18 and its drain is connected to node 21 to which is connected the source of P3 and the drain of N3. The drain of P3 is connected to node 25 to which is connected the drain of N1 and the gates of P4 and N4. The source of N1 is connected to node 27 to which is connected the drain of N2 and the drain of P5. The sources of N2, N4 and N5 are connected to terminal 20 and the sources of P4 and P5 are connected to terminal 18.

As connected, the output (node 25) of the second stage is applied to the input of an intermediate control stage, inverter I4, comprised of IGFETS P4 and N4. The drains of P4 and N4 are connected to output node 5 to which is connected the gates of P5 and N3. The source of N3 is connected to node 26 to which is connected the gate and drain of N5. N5 is connected as a "diode" and when power is applied to it, functions to raise the potential at node 26 to $V_T$ volts above ground. this prevents node 21 from being clamped to a voltage of less than $V_{TN}$ volts. The output (node 5) of Inverter I4 is fed back via a first feedback network comprised of N3 and N5 to node 21 at the intersection of P2 and P3 and via a second feedback network comprised of P5 to node 27 at the intersection of N1 and N2. The output of I4 and the second feedback network (P5) determine when N1 is turned on when the power is rampng up. The output of I4 and the first feedback network (N3, N5) determine when P3 is turned on when the power is ramping down. The output 5 of inverter I4 is also coupled to the input of an output complementary inverter I6 comprised of IGFETS P6 and N6.

The gates of P6 and N6 which form the input of I6 are connected to node 5, the sources of P6 and N6 are respectively connected to terminals 18 and 20 and their drains are connected to output node 6 at which is produced the POR-OUT signal. Inverter I6 functions as a buffer isolating the power-on circuitry from the rest of the system (not shown). In the circuit of FIG. 1, the substrates of the P-type devices are all returned to terminal 18 and the substrates of the N-type devices are all returned to terminal 20.

Figure 2:
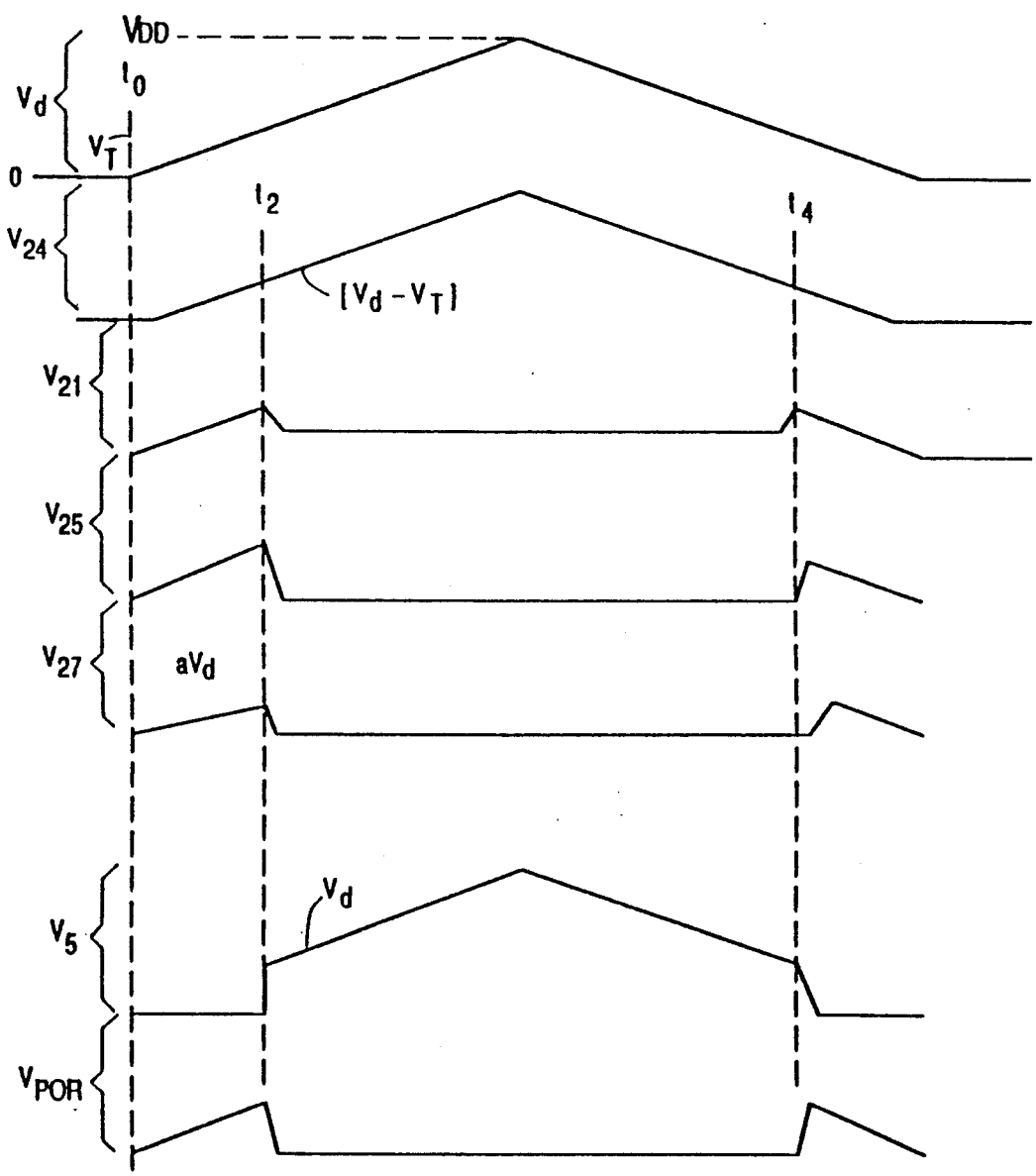
FIG. 2 is a diagram of waveforms associated with the circuit of FIG. 1.

The operation of the circuit of FIG. 1 will now be explained with reference to the waveform diagram of FIG. 2.

Assume that the potential $V_{SS}$ applied to terminal 20 is ground potential. Assume also that, initially, the potential Vd applied to terminal 18 is at ground and that all the nodes of the circuit of FIG. 1 are discharged to ground. Assume now that Vd ramps up towards its full potential of $V_{DD}$ volts as shown in FIG. 2. As Vd goes positive, rising from zero volts to $V_{DD}$ volts, the following conditions exist and/or are generated:

1. Node 24 remains at zero volts until Vd exceeds the threshold voltage ($V_T$) of P1. Thereafter, V24 is equal to $Vd - V_T$ of P1.

2. As soon as the potential at terminal 18 exceeds the voltage at node 24 by $V_T$ volts (or more), P2 is ON and P3 is turned-on and the voltage (V25) at node 25 ramps up as Vd increases.

3. As V25 rises above $V_T$ volts and ramps up as Vd increases, N4 is turned-on while P4 is turned-off. As N4 turns-on, the voltage at node 5 (which was initially at zero volts and which tended to follow Vd via P5), is clamped to zero volts via the conduction path of N4.

4. The zero volts developed at node 5 ensures that P5 is turned-on and generates a positive bias voltage ($V_X$) at node 27. The significance of applying this positive bias voltage at node 27 is that N1 cannot turn-on until the voltage V24 at node 24 exceeds the voltage V27 at node 27 by $V_T$ volts.

5. As V24 becomes more and more positive, transistor N2 becomes more and more conductive. But, the voltage developed at node 27 has a value which is a function of the impedance of P5 and N2. P5 and N2 function as a voltage divider connected between terminal 18 and ground, with the source of N1 connected at node 27 along the divider. By making P5 a smaller or larger impedance relative to N2, the voltage at which N1 is turned-on may be controlled.

6. At a time identified as t2 in FIG. 2, assume that V24 exceeds V27 by $V_T$ volts. When that occurs, N1 is turned-on and node 25 is then discharged towards ground. This causes P4 to be turned-on and N4 to be turned-off. The turn-on of P4 causes node 5 to go to Vd, turning off P5 and accelerating the discharge of nodes 25 and 27 to ground via the conduction paths of N1 and N2.

7. During the initial ramp up period from time t0 to time t2, V5 is at ground potential causing P6 to be on. Hence, until time t2, the output voltage ($V_{POR}$) at node 6 ramps up at the same rate as Vd. However, at time t2, when V5 is switched to Vd volts, P6 is turned-off and N6 is turned-on and $V_{POR}$ is clamped to ground.

8. When, at time t2, V5 is switched to Vd volts, Vd volts are applied to the gate of N3, turning-it-on. When N3 is turned-on, it clamps node 21 via its conduction path and diode connected N5 to ground. In effect, the turn-on of N3 establishes a bias voltage ($V_Y$) at node 21 equal to the $V_T$ of N3 plus the drain-to-source (or gate-to-source) voltage of N5. This bias voltage (Vy) turns off P3 and prevents P3 from being turned-on until V24 decreases below V21 by the threshold voltage ($V_T$) of P3. Thus, at time t2, V5 goes to $V_D$ volts, while V25 and V27 are driven to ground and V21 is driven to a voltage (Vy) which is equal to the voltage drop across the conduction paths of N3 and N5 (a voltage greater than $V_T$ volts) as shown in FIG. 2.

It has thus been shown that the circuit of FIG. 1 will produce a positive going power-on reset output pulse (POR-OUT) at node 6 when Vd ramps up from zero volts to a value which exceeds a predetermined threshold level (i.e. $V_t + V_{27}$) As long as Vd exceeds the value of $V_T + V_{27}$ at time t2, the POR circuit no longer changes state and $V_{POR}$ remains at, or close to, zero volts.

It will now be shown that the POR circuit of FIG. 1 produces an output pulse when the amplitude of Vd falls below a specified threshold level.

As Vd decreases, the circuit remains in the state discussed above until P3 is turned-on at time t4. P3 turns-on when V24 is $V_T$ volts below the voltage (VY) at node 21. When that occurs, P3 turns-on and there is conduction via P2 and P3 into node 25, raising the potential of V25 towards Vd volts. [Since Vd is decreasing, N1 and N2 are no longer on very hard and P2 and P3 can therefore cause V25 to go positive towards Vd volts.] The rise in potential at node 25 is such that when V25 comes within $V_T$ volts of Vd, P4 is turned-off and N4 is turned-on and the potential at node 5 is switched from Vd volts to ground potential. Clamping the voltage at node 5 to ground, turns off N3, accelerating the pull of node 25 to Vd volts via P2 and P3. At the same time, ground applied to the gate of P5, turns-it-on and causes a bias potential to be applied to node 27, in a direction to turn-off N1. Concurrently, clamping node 5 to ground causes P6 to be turned-on and N6 to be turned-off and a positive pulse is developed via P6 at the output terminal. The positive going pulse will decay to ground as Vd ramps down to ground.

The circuit of FIG. 1 thus provides an output pulse when the power supply voltage drops below a predetermined threshold value. The circuit of FIG. 1 thus has two threshold values, one threshold value controlling the point at which a pulse is produced when power is ramping up and the other threshold value controlling the point at which a pulse is produced when power is ramping down.

It should be evident that no capacitors are used in the circuit of FIG. 1 and hence, the circuit of FIG. 1 can respond to a wide range of varying power supply ramp rates.

The power-on reset (POR) circuit of the invention was designed for operation in an automotive environment where the power supply can exhibit varying ramp up rates, limited regulation and high susceptibility to a wide range of electrical noises. However, the invention is not limited to this application. The POR circuit of the invention contains no energy storing elements (i.e. capacitors) since these elements typically create either delays to the sensing of a specific voltage threshold value or an output response inertia which is usually undesirable. In general, the POR circuit of the invention could be used whenever a relatively simple double value threshold detector is needed such as in oscillator ckts, peak to peak noise detectors, and delay/timing pulse generators.

What is claimed is:

1. The combination comprising:
   first and second power terminals for the application therebetween of an operating potential;
   first and second insulated-gate field-effect transistors (IGFETS) of first conductivity type and third and fourth IGFETS of second conductivity type, each IGFET having a conduction path and a control electrode for controlling the conductivity of the conduction path; said first and second IGFETS, having their conduction paths connected in series between said first power terminal and a first node; said third and fourth IGFETS, having their conduction paths connected in series between said first node and said second power terminal;
   means for coupling the operating potential present at one of said first and second power terminals to the control electrodes of said first, second, third and fourth IGFETS;
   an inverting means having an input coupled to said first node and having an output; and
   bias means coupled between the output of said inverting means and the intersection of the conduction paths of said first and second IGFETS and the conduction paths of said third and fourth IGFETS for generating a first bias voltage applied at the intersection of the conduction paths of said third and fourth IGFETS for controlling the voltage at which said third IGFET conducts and for generating a second bias voltage applied at the intersection of the conduction paths of said first and second IGFETS for controlling the voltage at which said second IGFET conducts.

2. The combination as claimed in claim 1, wherein said bias means includes:
   a fifth IGFET having its conduction path connected between one of said first and second power terminals and the intersection of the conduction paths of said third and fourth IGFETS;
   a sixth IGFET having its conduction path connected between one of said first and second power terminals and the conduction paths of said first and second IGFETS; and
   means coupling the control electrodes of said fifth and sixth IGFETS to said output of said inverting means.

3. the combination as claimed in claim 2, wherein said fifth IGFET is of said first conductivity type and said sixth IGFET is of said second conductivity type.

4. The combination as claimed in claim 1, wherein said inverting means includes a fifth IGFET of said first conductivity type and a sixth IGFET of said second conductivity type, the control electrodes of said fifth and sixth IGFETs being connected to said first node, the conduction path of said fifth IGFET being connected between said first power terminal and a second node and the conduction path of said sixth IGFET being connected between said second node and said second poweer terminal; and
   wherein said biasing means includes a seventh IGFET of said first conductivity type having its conduction path connected between said first power terminal and the intersection of the conduction paths of said third and fourth IGFETS and its control electrode connected to said second node; and an eighth IGFET of said second conductivity type having its conduction path connected between said second power terminal and the intersection of the conduction of said first and second IGFETS and having its control electrode connected to said second node.

5. The combination as claimed in claim 4, wherein said means for coupling the operating potential includes a ninth IGFET having its conduction path connected between one of said first and second power terminals and a third node whereby the control electrodes of said first, second, third and fourth IGFETS are connected to said third node and wherein an impedance is connected between said third node and the other one of said first and second power terminals.

6. The combination comprising:
   first and second power terminals for the application therebetween of an operating potential;
   first and second IGFETS having their conduction paths connected in series between said first power terminal and a first node; third and fourth IGFETS having their conduction paths connected in series between said first node and said second power terminal;
   means for coupling the operating potential to the gate electrodes of said first, second, third and fourth IGFETS;
   an inverter having a signal input, a signal output and first and second operating terminals connected to said first and second power terminals, respectively;

means connecting said signal input of said inverter to said first node; and a first biasing network connected between said signal output of said inverter and the intersection of the conduction paths of said first and second IGFETS and a second biasing network connected between said signal output of said inverter and the intersection of the conduction paths of the third and fourth IGFETS.

7. The combination comprising:

first and second power terminals for the application therebetween of an operating potential;

first and second insulated-gate field-effect transistors (IGFETS) of first conductivity type and third and fourth IGFETS of second conductivity type, each IGFET having a conduction path and a control electrode for controlling the conductivity of the conduction path; said first and second IGFETs, having their conduction paths connected in series between said first power terminal and a first node; said third and fourth IGFETs, having their conduction paths connected in series between said first node and said second power terminal;

means for coupling the operating potential present at one of said first and second power terminals to the control electrodes of said first, second, third and fourth IGFETs;

inverting means having an input coupled to said first node, said inverting means having an output; and feedback means coupled between the output of said inverting means and said first, second, third and fourth IGFETs for generating a first bias voltage applied at the intersection of the conduction paths of said third and fourth IGFETS for controlling the voltage at which said third IGFET conducts and for generating a second bias voltage applied at the intersection of the conduction paths of said first and second IGFETs for controlling the voltage at which said second IGFET conducts.

* * * * *